United States Patent [19]
Speer et al.
[11] 3,824,507
[45] July 16, 1974

[54] PARITY OF TUNING APPARATUS

[75] Inventors: Walter Franklin Speer, Speedway City; Lloyd Edward Reed, Indianapolis, both of Ind.
[73] Assignee: RCA Corporation, New York, N.Y.

[22] Filed: Mar. 23, 1973
[21] Appl. No.: 344,297

[52] U.S. Cl. 334/47, 74/10.6, 74/10.8, 325/452, 325/464, 334/50, 334/52
[51] Int. Cl. H03j 5/00
[58] Field of Search 334/47, 50, 51, 52, 88; 74/10.6, 10.8; 315/452, 464

[56] References Cited
UNITED STATES PATENTS

| | | | |
|---|---|---|---|
| 3,234,490 | 2/1966 | Dickinson et al. | 334/51 |
| 3,251,234 | 5/1966 | Valdettaro | 74/10.8 X |
| 3,364,753 | 1/1968 | Bidlack | 74/10.8 X |
| 3,453,896 | 7/1969 | Tonari et al. | 74/10.6 X |
| 3,459,055 | 8/1969 | Sperber | 74/10.8 |
| 3,518,888 | 7/1970 | Valdettaro et al. | 74/10.6 X |
| 3,740,679 | 6/1973 | Kimura et al. | 334/88 |

*Primary Examiner*—James W. Lawrence
*Assistant Examiner*—Saxfield Chatmon, Jr.
*Attorney, Agent, or Firm*—Eugene M. Whitacre

[57] ABSTRACT

A television tuning apparatus which provides a single selector shaft for selecting channels in both the VHF and UHF bands wherein the single selector shaft is coupled to a conventional VHF rotary mechanical detent switch tuner and to a switch connected to a series of preset potentiometers which provide tuning voltages for a varactor UHF tuner. The apparatus sequentially selected VHF channels and UHF channels maintaining a uniformity of tuning ease throughout both bands of tuning.

10 Claims, 2 Drawing Figures

PARITY OF TUNING APPARATUS

BACKGROUND OF THE INVENTION

This invention relates to a television receiver apparatus and more particularly to such tuner apparatus featuring VHF and UHF tuner channel selection which complies with current parity of tuning requirements set forth by the Federal Communications Commission.

Television receivers currently manufactured for use in the United States must have tuning apparatus which, insofar as the person tuning the receiver is concerned, provides for tuning of the UHF television channel with the same degree of ease as tuning of the VHF channels. This requirement is referred to as "parity of tuning."

Presently, a large percentage of the VHF tuners of the mechanical detented type are either of a rotary switch or a turret construction enabling the operator to sequentially select any one of a plurality of VHF channels. Such detent arrangements for VHF incorporate 12 separate positions necessary to tune to each of the FCC allocated VHF television channels. Detented tuning is commercially preferred over continuous tuning because accurate tuning may be accomplished rapidly and without particular care by the viewer.

Tuners for the UHF band (70 FCC allocated channels) have for some time been of a mechanical continuously tuned type. This type of tuning mechanism is generally considered to be more difficult to use when attempting to accomplish optimum tuning of a desired channel. Recent opposition to the difference of tuning of each of the UHF band and the VHF band has resulted in the requirement by the FCC that future designs of television receiver apparatus provide "parity of tuning."

To provide "parity of tuning," detent tuning apparatus have been developed such as that shown in U.S. Pat. No. 3,459,055 filed in the name of Edward J. Sperber. These apparatus, when attached to a standard, mechanical, continuously tunable UHF tuner, provide for a degree of parity. However, they do not provide for a total identity of operating characteristics between UHF and VHF. This is due, for example, to differences between VHF and UHF channel displays, differences between VHF and UHF detent feel, duality of knobs, and lack of one detent per allocated channel in the UHF band.

Detented tuning apparatus which would provide one detent per allocated channel in the UHF band has been extremely difficult to achieve within the price limitations of consumer products. However, since UHF transmission requires a line of sight propagation between the transmitting antenna and the receiving antenna, reception of signals broadcast by distant UHF stations is extremely unlikely. To date, the maximum number of allocated UHF channels in a particular area has been used as a criteria for determining the number of UHF detent positions required to meet FCC parity standards. Therefore, as few as six detents and as many as 24 detents have been considered to comply with the interim parity requirements. Detent apparatus to accomplish up to 24 detent positions has been considered to be economically feasible and such systems have been marketed.

SUMMARY OF THE INVENTION

One embodiment of the present invention is directed to an apparatus which provides for selection of a channel to be received by a television receiver capable of receiving signals in a plurality of frequency bands by the use of a single operator-activated selector shaft. A first tuner selects from a first band of frequencies a channel to be received by the positioning of an incrementally positionable shaft. A second tuner selects from a second band of frequencies a channel to be received by the placing of an appropriate tuning potential on a tuning potential input terminal of the second tuner. A plurality of adjustable potentials are selected and connected one at a time to the tuning potential input terminal of the second tuner by a switch coupled to the single operator-activated selector shaft and having a plurality of terminals each connected to a respective one of the plurality of adjustable potentials and a common terminal connected to the tuning potential input terminal of the second tuner. A means for providing coupling of the single operator-activated selector shaft to the incrementally positionable shaft is adapted for rotating the incrementally positionable shaft sequentially through a predetermined number of positions to a selected position at which position movement of the incrementally positionable shaft is interrupted and continued rotation of the single operator-activated selector shaft rotates the switch sequentially through a predetermined number of positions after which movement of the incrementally positionable shaft is reinstated.

BRIEF DESCRIPTION OF THE DRAWINGS

These and other advantages of the invention will be more readily apparent from a consideration of the following description taken in connection with the accompanying drawings in which.

DETAILED DESCRIPTION OF THE DRAWINGS

Figure 1:
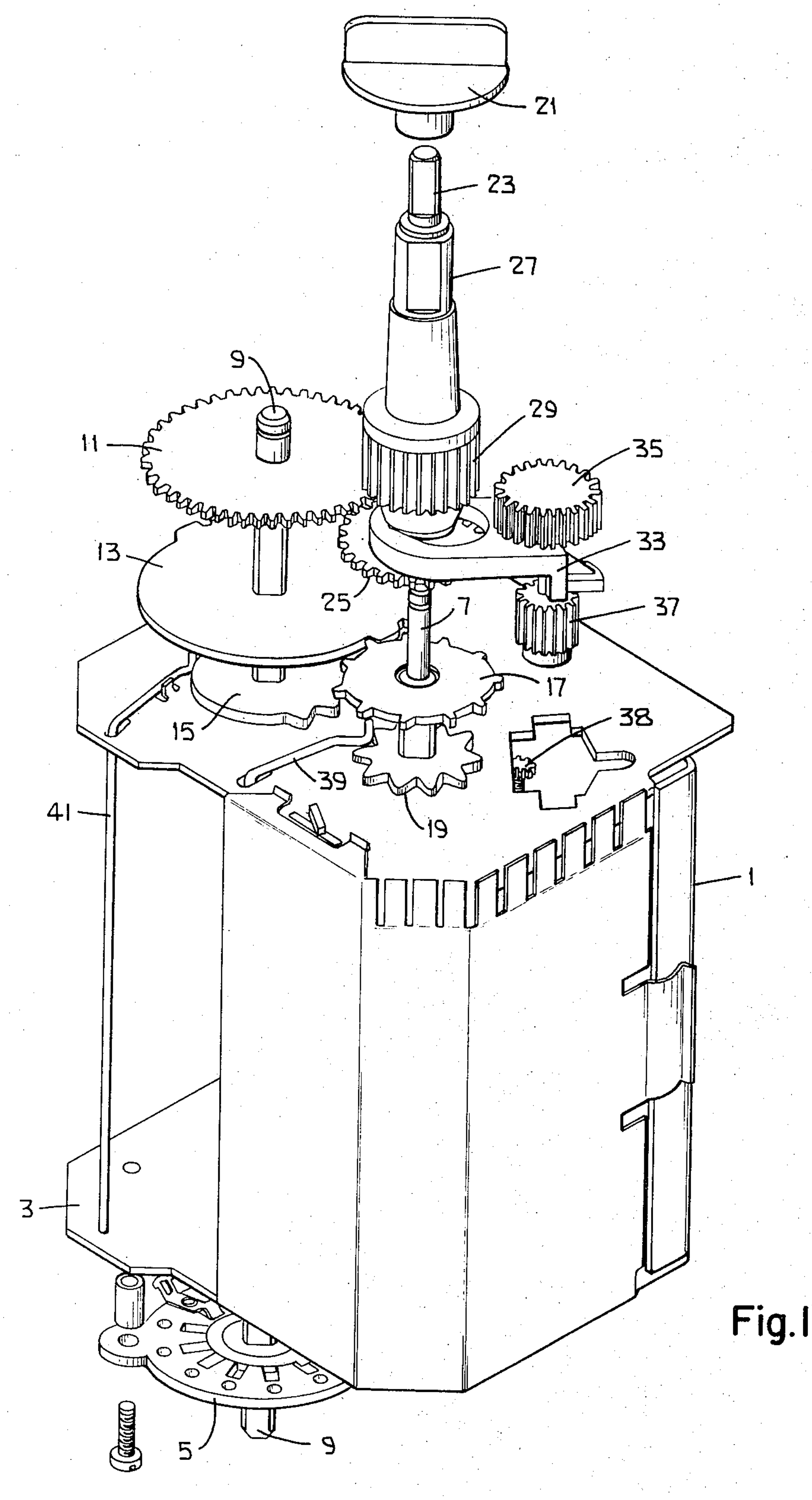
FIG. 1 is an isometric view of apparatus providing a single shaft control of frequencies in the VHF and UHF bands. In addition, a tuner used for VHF reception and a switch utilized to select a control potential necessary to select channels in the UHF spectrum are included.

Referring to FIG. 1, a VHF tuner assembly 1 has a mounting structure 3 affixed thereto to support a UHF channel selection switch assembly 5. In such manner, a control shaft 7 and a control shaft 9 are held with their rotational axes in a fixed parallel spacing. The shafts 7 and 9 each are shown elongated for purposes of illustration.

A spur gear 11, a mutilated spur gear 13 and a detent wheel sector 15 are securely affixed to shaft 9 and rotate with the shaft 9 around its axis of rotation. As used herein, the term mutilated gear refers to an arrangement of the type shown in FIG. 1 wherein a portion of the periphery of the gear includes teeth (a non-mutilated portion) and a portion of the periphery of the gear is smooth (that is mutilated) and of a diameter corresponding to the approximate root diameter of the non-mutilated portion. Normally, spur gear 11, mutilated spur gear 13 and detent wheel sector 15 are mounted with minimal clearance between 11 and 13 and between 13 and 15. A spur gear 17 and a detent wheel 19 rotate with the shaft 7 around its axis of rotation. Normally, spur gear 17 and detent wheel 19 have minimal clearance between them.

A coarse tuning or channel selection knob 21 is mounted on a coarse tuning knob shaft 23. Shaft 23 has a spur gear 25 affixed to its end remote from the knob 21, is hollow and forms a sleeve around the shaft 7 and rotates freely thereabout except for the intermeshing of gears 25 and 11, and the intermittent meshing of gears 13 and 17.

A spring-loaded fine tuning knob shaft 27 forms a freely rotatable sleeve around the hollow shaft 23 as shown. The fine tuning knob, omitted for clarity of illustration, drives a gear 29 integral with the shaft. When the fine tuning knob is pushed toward tuner 1 it will move a spring-loaded slide mechanism 33 to engage a gear 35 with the gear 29 and engages a gear 37 with a gear 38 in VHF tuner 1 (gear 37 within tuner 1 when shaft is of normal length). Engaging and turning the gear 35 will fine tune inductors contained in the VHF tuner 1. A fine tuning mechanism of the type described is of a conventional design and may be of the type disclosed in U.S. Pat. No. 3,210,485.

A detent spring 39 cooperates with detent wheel 19 to provide incremental positioning of shaft 7. A detent spring 41 cooperates with mutilated detent wheel 15 to provide incremental positioning of shaft 9.

The ability to mount the fine tuning knob shaft 27 and the coarse tuning shaft 23 concentrically with control shaft 7 is a feature of the embodiment of the present invention as shown in FIG. 1. This ability permits the VHF tuner assembly 1 and the fine tuning apparatus 27, 29, 33, 35 to be essentially the same as that employed in a conventional VHF tuner of the rotary switch type, eliminating the need for extensive retooling to build a channel selector offering parity of VHF and UHF tuning characteristics.

In operation, rotation of the coarse tuning knob 21 provides for sequential selection of 12 VHF channels and 8 UHF channels. To provide for this type of selection, the turning of the coarse tuning knob 21 is transmitted by the shaft 23 to cause a corresponding turning of the spur gear 25. Spur gears 25 and 11 intermesh at all times to cause the shaft 9 to turn in response to and in counter rotation with the shaft 23. With the orientation of the tuner and the positioning of the several gears shown in the drawing, as knob 21 is rotated clockwise (as viewed from the knob end of shaft 23), the shafts 23 and 9 turn clockwise and counterclockwise respectively. The illustrated relationship of gears 13 and 17 corresponds to the VHF tuning shaft 7 being in the UHF position. Thus, as knob 21 is rotated clockwise the 8 positions of the UHF tuning range will be stepped through first. In each position, the detent spring 41 will engage a different space between teeth of the detent wheel sector 15. In each detent position, a different contact on the UHF channel selection switch assembly 5 will be closed.

In each of these 8 positions of the UHF tuning range, the mutilated (non-toothed) section of the gear 13 will turn past the gear 17 without engaging it. Consequently, the gear 17, the shaft 7 and the VHF detent wheel 19 will remain stationary. Accordingly, the VHF tuner 1 will remain in a position where it is set for UHF operation. This may be a position where the VHF tuner is not inoperative altogether or in accordance with conventional practice, the VHF tuner may be arranged to provide supplemental IF or conversion functions for UHF reception. The detent spring 39 holds the detent wheel 19, the shaft 7 and the spur gear 17 in this position when the spur gear 17 is not turned by gear 13.

After stepping through 8 positions in the UHF tuning range, the detent spring 41 will no longer engage detents in the detent wheel sector 15, and the feed of this detent action will no longer be transmitted by shaft 9, gears 11 and 25 and shaft 23 back to the coarse tuning knob 21. However, the non-mutilated portion of the gear face of gear 13 will intermesh with gear 17. Therefore, the feel of the detent action of the detent spring 39 against detent wheel 19 will be transmitted by shaft 7, gears 17 and 13, shaft 9, gears 11 and 25, and shaft 23 back to the coarse tuning knob 21. This transition from one detent action to the other being coupled back to the tuning knob 21 is important to assure that similarity of tuning characteristics is provided regardless whether the shaft 9 is being turned through the channels of the UHF band (switching the channel selection switch 5) or through the VHF band (turning the shaft of VHF tuner 1).

The detent spring 39 and the detent wheel 19 provide detent action for switching by steps through the VHF range. Such switching proceeds through the VHF channels as in prior art VHF tuning apparatus as the knob 21 is turned farther clockwise except for the fact that the rotation of the coarse tuning knob is indirectly transmitted to the control shaft 7 via the sleeve 23, gears 25 and 11, shaft 9, and gears 13 and 17. The detent spring 39 and the detent wheel 19 as noted above also provide a means for holding the position of the shaft 7 during switching through the UHF tuning range, when gears 13 and 17 do not intermesh. This dual function of the detent spring 39 and the detent wheel 19 provides an economy of mechanical parts.

After stepping through the VHF tuning range, the gear 13 will have advanced to the point where the mutilated portion of its gear face will turn by the gear 17, and the detent spring 41 will engage the spaces between the teeth of the detent wheel sector 15 as the knob 21 is turned farther clockwise.

While the channel selection as described above was accomplished by a clockwise rotation of knob 21, first through the UHF channels and then through the VHF channels, a counterclockwise rotation of knob 21 is also possible. The interactions between the moving elements of the coarse tuning mechanism of the channel selector and the counterclockwise rotation being similar to that heretofore described except for change in direction of rotation.

Figure 2:
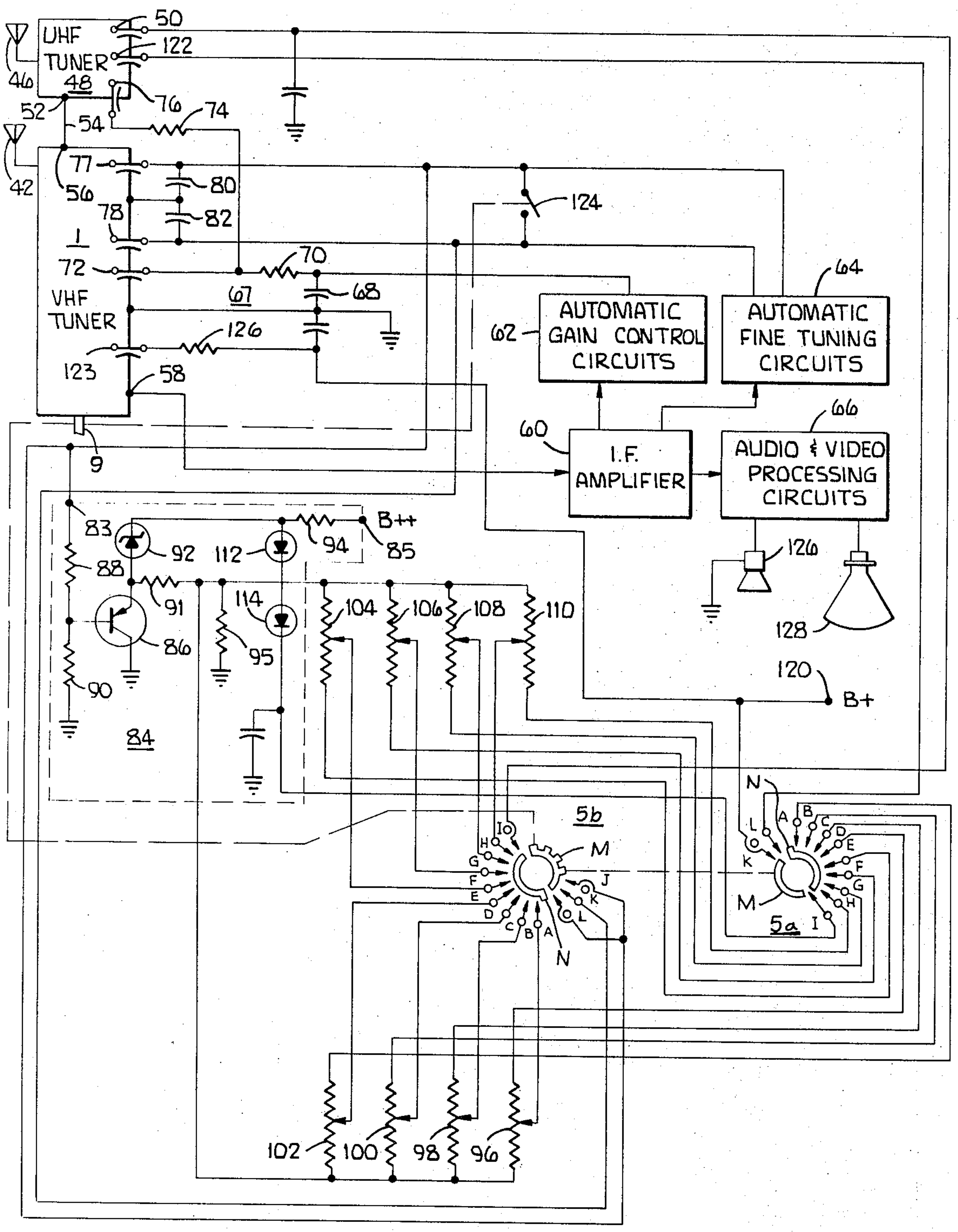
FIG. 2 is a schematic diagram, partly in block form, showing electrical connections between the respective elements of a tuning control apparatus according to the invention.

Referring now to FIG. 2, a schematic diagram of a system utilizing the mechanism of FIG. 1 is shown. In FIG. 2, an antenna 42 utilized for the interception of VHF television signals is coupled to a VHF tuner 1. Tuner 1 is a mechanical detented type having a detent position for each of the allocated VHF channels (2–13) and an additional detent position (UHF) for the amplification of intermediate frequencies (IF) supplied from an associated UHF tuner 48. Electrically, tuner 1 operates in a conventional manner thus selectively providing VHF television signal amplification and conversion to IF signals or providing amplification for previously converted UHF television signals.

An antenna 46 utilized for the interception of UHF television signals is coupled to a UHF tuner 48. Tuner 48 is of the varactor tuner type and may be tuned to any one of 70 allocated UHF channels (14–83) by altering a tuning voltage coupled to a terminal 50. Electrically, tuner 48 operates in a conventional manner and thereby provides a conversion of UHF television signals to IF signals. An IF signal output connector 52 of UHF tuner 48 is coupled by a shielded cable 54 to an IF signal input connector 56 of VHF tuner 1, thereby providing a means of coupling IF signals developed in the UHF tuner 48 into the VHF tuner 44 for amplification.

An IF signal output terminal 58 of VHF tuner 44 is coupled to an IF amplifier 60 which provides additional amplification. The IF amplifier 60 is coupled to conventional automatic gain control circuits 62, automatic fine tuning circuits 64 and audio and video processing circuits 66.

The automatic gain control (AGC) circuits 62 develop an output voltage which is proportional to the average level of signal received by the antenna 42 or the antenna 46.

This AGC output voltage is coupled through a low pass network 67 comprising a capacitor 68 and a resistor 70 to terminal 72 of VHF tuner 1. This AGC output voltage is also coupled to UHF tuner 48 through the low pass filter 67. However, a resistor 74 is provided for additional filtering of AGC prior to being coupled to terminal 76 of the UHF tuner 48.

Automatic fine tuning (AFT) circuit 64 develops an output voltage which is utilized to control the VHF tuner 1 and UHF tuner 48 to maintain a predetermined IF signal at the output terminal 58 of the VHF tuner 1 throughout the tuning of both VHF and UHF channels. The output signal of the automatic fine tuning circuit 64 is coupled to terminals 77 and 78 of the VHF tuner 1 by a low pass filter comprising capacitors 80 and 82.

The output signal of automatic fine tuning circuit 64 is also coupled to an input terminal 83 of a tuning voltage supply circuit 84. In coupling the output signal from automatic fine tuning circuit 64 to the tuning voltage supply circuit 84, output supply voltages are varied in order to maintain proper tuning of the UHF tuner 48. The output supply voltages are also compensated for voltage variations of a B++ supply 85 and environmental temperature variations to which the system is subjected.

A resistive divider comprising a resistor 88 and a resistor 90 is connected between input control terminal 83 and a reference potential. A common connection of resistors 88 and 90 is connected to a base terminal of a PNP transistor 86 having a collector electrode connected to ground and an emitter electrode connected to a resistor 91 and the anode of a zener diode 92. Resistors 88 and 90 may be altered in resistive value to establish the amount of AFT correction coupled to the UHF tuner 48 as compared to the AFT correction coupled to the VHF tuner 1.

The cathode of zener diode 92 is connected to B++ supply 85 by means of resistor 94 thus providing collector-emitter bias for transistor 86 and zener breakdown bias for zener diode 92.

A resistor 95 is connected in series combination with resistor 91 between the emitter of transistor 86 and ground. Potentiometers 96–110, each comprising a resistive element with a first fixed contact, a second fixed contact, and a movable contact, all have their first fixed contacts connected to the common connection of resistors 91 and 95. The second fixed contacts of the potentiometers 96–110 are connected to a portion **5*a* of switch 5, contacts A through H respectively. Contact I of switch portion 5*a* which is a common contact for contacts A through H is connected to the junction of zener diode 92 and resistor 94 via a diode 112 and a diode 114. Contact I and contacts A through H of switch portion 5*a* in conjunction with a rotor contact N of switch portion 5*a* provide for selective coupling between contact I and contacts A through H of switch portion 5*a*. Diodes 112 and 114 are poled for efficient current conduction from the junction of zener diode 92 and resistor 94 to the second fixed contact of the potentiometer selected by switch portion 5*a*. These diodes 112 and 114 provide compensation for temperature variations that occur in the UHF tuner and in the base emitter junction of transistor 86.**

The movable contact on each of the potentiometers 96–110 is connected to respective contacts A–H of a switch portion **5*b*. Contact I of switch portion 5*b*, which is a common contact for contacts A through H, is connected to terminal 50 of UHF tuner 48 thus providing a selection of one of 8 preset tuning voltages for use in tuning UHF tuner 48. Contact I and contacts A through H of switch portion 5*b* in conjunction with a rotor contact N of switch portion 5*b* provide for selective coupling between contact I and contacts A through H of switch portion 5*b*.**

B+ supply 120 is connected to contact K of switch portion **5*a*, and contact L is connected to terminal 122 of UHF tuner 48. These contacts, in conjunction with a rotor contact M of switch portion 5*a*, provide switching of B+ to the UHF tuner 48 when it is desirable to receive UHF television signals. B+ supply 120 is also connected to terminal 123 of VHF tuner 1 via resistor 126.**

On switch portion **5*b*, contacts J and L are connected to terminal 77 on the VHF tuner 1 and contact K is connected to terminal 78 on VHF tuner 1. The contacts J, K and L in conjunction with a rotor contact M of switch 118 provide a shorting out of the AFT circuit output between detent positions when selecting UHF television signals. A switch 124, which is ganged to a VHF tuner detent wheel 19 (FIG. 1**) provides a shorting out of the AFT circuit output between detent positions when selecting VHF television signals.

Tereminals 50, 76 and 122 of UHF 48 and terminals 72, 77, 78 and 123 of VHF tuner 1 are bypassed to ground by appropriate feedthrough capacitors to prevent unwanted signal radiation.

The audio and video processing circuits 66 are coupled, respectively, to an audio reproducer 126 which converts electrical signals into mechanical vibrations and to a television picture tube 128 which converts electrical signals into light intensity modulation and light position modulation.

In operation, VHF television signals or UHF television signals may be selected for audio and video reproduction on speaker 126 and picture tube 128, respectively. When the VHF tuner 1 is adjusted to receive any one of the allocated VHF channels (2–13), the VHF tuner 1 is energized by a B+ supply 120 and the signal received by antenna 42 is processed through the VHF tuner 1 and IF amplifier 60 in a conventional manner. Any gain correction or frequency correction required by the VHF tuner 1 is provided by AGC circuits 62 and AFT circuits 64, respectively. The signal output from the IF amplifier is, therefore, optimized by AGC circuits 62 and AFT circuit 64. Signals thus received by audio and video processing circuit 66 and subsequently picture tube 128 and speaker 126 are optimized within television signal condition limitations. Also, during VHF reception switch portion *5a* contacts K and L are not shorted by rotor contact M; therefore, the B+ supply 120 is not connected to the UHF tuner 48. This condition renders UHF tuner 48 inoperative which minimizes the chance of the UHF tuner interfering with VHF reception.

When it is desirable to receive UHF television signals, contacts K and L of switch portion *5a* are shorted by rotor contact M, thus providing B+ to the UHF tuner 48 by connection to terminal 122. The UHF tuner 48 being energized, processes in a conventional manner UHF television signals intercepted by antenna 46 which results in a normal IF signal at connector 52 if an appropriate tuning voltage has been coupled to terminal 50 of UHF tuner 48. This IF signal is coupled by cable 54 to connector 56 of VHF tuner 1. When receiving UHF television signals, the VHF tuner functions as an IF amplifier to make possible the same IF signal level at terminal 58 of VHF tuner 1 during UHF signal reception as exists during VHF signal reception. The signal processing through the IF amplifier 60, AGC circuits 62, AFT circuit 64 and audio and video processing circuit 66 to picture tube 128 and speaker 126 is, therefore, the same in UHF signal reception as in VHF signal reception. The output of AGC circuit 62 controls the gain of the UHF tuner by means of a coupling to terminal 76 thus maintaining optimum signal level conditions throughout the system. To optimize the tuning of the UHF tuner 48 in order to provide an acceptable IF signal at output connector 52, the output of the automatic fine tuning circuit 64 is coupled to the input terminal 83 of tuning voltage supply circuit 84.

As the voltage at input terminal 83 varies, a proportional amount of change occurs at the emitter of transistor 86 due to the voltage dividing action of resistors 86 and 90. Since the zener diode 92 has a relatively constant voltage drop, the voltage change at the emitter appears at the junction of zener diode 112 and resistor 94. Due to the dividing action of resistors 91 and 95, the voltage at the common connection of these resistors is proportional to, but less than, the voltage at the emitter of transistor 86.

The potentiometers 96–110, being selectively connected by switch portion *5a* contacts A–H, respectively, to the common connection of zener diode 92 and resistor 94 via switch portion *5a* rotor contact N, contact I and diodes 112 and 114, have output voltages at their movable contacts which with respect to reference potential vary in relationship to the automatic fine tuning circuit 64.

As the rotors of switches portions *5a* and *5b* are turned to select different potentiometers for connection to the output of voltage power supply circuit 84 and to select the movable contact associated with the selected potentiometer for connection to UHF tuner 48 tuning voltage terminal 50 via switch portion *5b* contacts A–H, rotor contact N and contact I, different preset UHF television signals are selected. With each selection the automatic fine tuning circuits 64 respond to errors in IF signal at terminal 58 and provide a correction voltage to which the tuning voltage supply circuit 84 responds.

One particular configuration corresponding to that illustrated in FIG. 2 is described in RCA Color Television Service Data, CT-10, File 1972, published by RCA Sales Corporation, 600 North Sherman Drive, Indianapolis, Indiana 46201.

What is claimed is:

1. In a television receiver capable of receiving signals in a plurality of frequency bands, an apparatus providing selection of channels within said bands by means of a single operator-activated selector shaft positionable in a predetermined number of positions comprising:
- a first tuner having an incrementally positionable shaft for selection of channels in a first band of frequencies;
- a second tuner which selects from a second band of frequencies channels to be received by the placing of an appropriate tuning potential on a tuning potential input terminal of said tuner;
- means for providing a plurality of adjustable tuning potentials;
- switch means continuously coupled to said operator-activated selector shaft, said switch means having a plurality of terminals each connected to a respective one of said plurality of adjustable tuning potentials and having a common terminal which is connected to said tuning potential input terminal of said second tuner;
- said common terminal being connected to any one of said plurality of terminals by the operation of said single operator-activated selector shaft in a portion of said predetermined number of positions; and
- means coupling said single operator-activated selector shaft to said incrementally positionable shaft, said means being adapted for positioning said incrementally positionable shaft when said operator-activated selector shaft is in those of said predetermined number of positions other than said portion.

2. The combination of claim 1 wherein said means coupling said single operator-activated selector shaft to said incrementally positionable shaft comprises:
- a non-mutilated gear coupled to said incrementally positionable shaft; and
- a mutilated gear coupled to said single selector shaft, said mutilated gear engaging said non-mutilated gear only when a non-mutilated sector of said mutilated gear is adjacent said non-mutilated gear.

3. The combination of claim 2 and further comprising:
- a mounting structure holding said incrementally positionable shaft and said operator-activated selector shaft in a manner providing operable engagement of said non-mutilated gear and said non-mutilated sector of said mutilated gear.

4. The combination of claim 3 and further comprising:
- a non-mutilated detent wheel coupled to said incrementally positionable shaft;
- a first detent spring operatively associated with said non-mutilated detent wheel to provide stable positioning of said incrementally positionable shaft;
- a mutilated detent wheel coupled to said operator-activated selector shaft, said mutilated gear and said mutilated detent wheel being mutilated over complementary sections of their circumference; and a second detent spring operatively associated with said mutilated detent wheel to provide stable positioning of said operator-activated selector shaft when said mutilated gear is not in engagement with said non-mutilated gear.

5. In a television receiver capable of receiving signals in a plurality of frequency bands, an apparatus providing selection of channels within said bands by means of a single operator-activated selector shaft comprising:

a first tuner having an incrementally positionable shaft for selection of channels in a first band of frequencies;

a second tuner which selects from a second band of frequencies channels to be received by the placing of an appropriate tuning potential on a tuning potential input terminal of said tuner;

means for providing a plurality of adjustable tuning potentials;

an auxiliary shaft positionable in a predetermined number of positions;

switch means continuously coupled to said auxiliary shaft, said switch means having a plurality of terminals each connected to a respective one of said plurality of adjustable tuning potentials and having a common terminal which is connected to said tuning potential input terminal of said second tuner, said common terminal being connected to any one of said plurality of terminals by the operation of said auxiliary shaft in a portion of said predetermined number of positions; and means coupling said single operator-activated selector shaft to said incrementally positionable shaft and said auxiliary shaft, said means being adapted for positioning said incrementally positionable shaft when said auxiliary shaft is in those of said predetermined number of positions other than said portion.

6. The combination of claim 5 wherein said means coupling said single operator-activated selector shaft to said incrementally positionable shaft and said auxiliary shaft comprises:

a non-mutilated gear coupled to said incrementally positionable shaft;

a mutilated gear coupled to said auxiliary shaft, said mutilated gear engaging said non-mutilated gear only when a non-mutilated sector of said mutilated gear is adjacent said non-mutilated gear;

a first spur gear coupled to said auxiliary shaft; and a second spur gear coupled to said operator-activated selector shaft, said second spur gear at all times engaging said first spur gear.

7. The combination of claim 6 and further comprising:

a mounting structure holding said incrementally positionable shaft and said auxiliary shaft in a manner providing operable engagement of said non-mutilated gear and said mutilated gear.

8. The combination of claim 7 and further comprising:

a non-mutilated detent wheel coupled to said incrementally positionable shaft;

a first detent spring operatively associated with said non-mutilated detent wheel to provide stable positioning of said incrementally positionable shaft;

a mutilated detent wheel coupled to said auxiliary shaft, said mutilated gear and said mutilated detent wheel being mutilated over complementary sectors of their circumferences; and a second detent spring operatively associated with said mutilated detent wheel to provide stable positioning of said auxiliary shaft when said mutilated gear is not in engagement with said non-mutilated gear.

9. The combination of claim 8 wherein said operator-activated selector shaft is concentrically and rotatably mounted on said incrementally positionable shaft.

10. The combination of claim 9 and further comprising:

a fine tuning shaft concentrically and slideably mounted on said operator-activated selector shaft; and fine tuning means for coupling said fine tuning shaft to said first tuner to provide fine frequency adjustments of said first tuner.

* * * * *